US009954716B2

(12) United States Patent
Stephens et al.

(10) Patent No.: US 9,954,716 B2
(45) Date of Patent: Apr. 24, 2018

(54) METHOD FOR SIGNALING INFORMATION BY MODIFYING MODULATION CONSTELLATIONS

(71) Applicant: Intel Corporation, Santa Clara, CA (US)

(72) Inventors: Adrian P. Stephens, Cottenham (GB); John S. Sadowsky, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/190,594

(22) Filed: Jun. 23, 2016

(65) Prior Publication Data

US 2017/0118061 A1    Apr. 27, 2017

Related U.S. Application Data

(63) Continuation of application No. 14/075,004, filed on Nov. 8, 2013, now Pat. No. 9,379,863, which is a continuation of application No. 13/929,142, filed on Jun. 27, 2013, now Pat. No. 9,270,429, which is a continuation of application No. 12/319,191, filed on Dec. 31, 2008, now Pat. No. 9,001,636, which is a continuation of application No. 11/018,414, filed on Dec. 20, 2004, now Pat. No. 7,474,608.

(60) Provisional application No. 60/536,071, filed on Jan. 12, 2004.

(51) Int. Cl.
*H04L 27/34* (2006.01)
*H04L 5/00* (2006.01)
*H04W 84/12* (2009.01)

(52) U.S. Cl.
CPC .......... *H04L 27/345* (2013.01); *H04L 5/0044* (2013.01); *H04W 84/12* (2013.01)

(58) Field of Classification Search
CPC ....... H04L 27/345; H04L 5/004; H04W 84/12
See application file for complete search history.

(56) References Cited

U.S. PATENT DOCUMENTS

| 5,548,618 | A | 8/1996 | Sehier et al. |
|---|---|---|---|
| 5,712,870 | A | 1/1998 | Petrick |
| 5,982,807 | A | 11/1999 | Snell |
| 6,219,356 | B1 | 4/2001 | Beukema |

(Continued)

FOREIGN PATENT DOCUMENTS

| CN | 1930825 A | 3/2007 |
|---|---|---|
| CN | 1930825 B | 5/2011 |

(Continued)

OTHER PUBLICATIONS

"U.S. Appl. No. 11/018,414, Advisory Action dated Sep. 29, 2008", 4 pgs.

(Continued)

*Primary Examiner* — Sam Rizk
(74) *Attorney, Agent, or Firm* — Schwegman Lundberg & Woessner, P.A.

(57) ABSTRACT

A wireless device may include processing circuitry that is configured to process a first portion of a packet, the first portion of the packet comprising a legacy signal (L-SIG) field, and determine whether a constellation of a field of a second portion of the packet is binary phase shift keying (BPSK) or quaternary binary phase shift keying (QBPSK). The processing circuitry may be further configured to: process the second portion of the packet in accordance with a packet structure indicated by the constellation.

23 Claims, 5 Drawing Sheets

(56) References Cited

U.S. PATENT DOCUMENTS

| | | |
|---|---|---|
| 6,940,843 B2 | 9/2005 | Goodall et al. |
| 7,050,768 B2 | 5/2006 | Hosur et al. |
| 7,075,906 B2 | 7/2006 | Douglas et al. |
| 7,203,207 B2 | 4/2007 | Hiben et al. |
| 7,263,651 B2 | 8/2007 | Xia et al. |
| 7,474,608 B2 | 1/2009 | Stephens et al. |
| 7,522,514 B2 | 4/2009 | Tzannes et al. |
| 8,495,459 B2 | 7/2013 | Myung et al. |
| 9,001,636 B2 | 4/2015 | Stephens et al. |
| 9,270,429 B2 | 2/2016 | Stephens et al. |
| 9,379,863 B2 | 6/2016 | Stephens et al. |
| 2002/0131478 A1 | 9/2002 | Somayazulu et al. |
| 2003/0012160 A1 | 1/2003 | Webster et al. |
| 2009/0122694 A1 | 5/2009 | Stephens et al. |
| 2010/0325511 A1 | 12/2010 | Oh et al. |
| 2013/0279379 A1 | 10/2013 | Yang et al. |
| 2013/0290807 A1 | 10/2013 | Stephens et al. |
| 2014/0064223 A1 | 3/2014 | Stephens et al. |

FOREIGN PATENT DOCUMENTS

| | | |
|---|---|---|
| CN | 102164107 A | 8/2011 |
| CN | 102164107 B | 11/2013 |
| EP | 0866588 A2 | 9/1998 |
| EP | 1712043 A1 | 10/2006 |
| EP | 1712043 B1 | 4/2009 |
| EP | 2056637 A2 | 5/2009 |
| HK | 1161942 B | 6/2014 |
| MY | 142160 A | 10/2010 |
| WO | WO-2005071898 A1 | 8/2005 |

OTHER PUBLICATIONS

"U.S. Appl. No. 11/018,414, Final Office Action dated Jul. 9, 2008", 10 pgs.
"U.S. Appl. No. 11/018,414, Non Final Office Action dated Dec. 28, 2007", 9 pgs.
"U.S. Appl. No. 11/018,414, Notice of Allowance dated Nov. 3, 2008", 7 pgs.
"U.S. Appl. No. 11/018,414, Response filed Mar. 25, 2008 to Non Final Office Action dated Dec. 28, 2007", 10 pgs.
"U.S. Appl. No. 11/018,414, Response filed Sep. 5, 2008 to Final Office Action dated Jul. 9, 2008", 10 pgs.
"U.S. Appl. No. 12/319,191, Appeal Brief filed Apr. 26, 2011", 21 pgs.
"U.S. Appl. No. 12/319,191, Appeal Decision dated Apr. 29, 2014", 6 pgs.
"U.S. Appl. No. 12/319,191, Decision on Pre-Appeal Brief Request dated Jan. 26, 2011", 2 pgs.
"U.S. Appl. No. 12/319,191, Examiner's Answer dated Jul. 8, 2011", 10 pgs.
"U.S. Appl. No. 12/319,191, Final Office Action dated Sep. 13, 2010", 10 pgs.
"U.S. Appl. No. 12/319,191, Non Final Office Action dated Mar. 2, 2010", 9 pgs.
"U.S. Appl. No. 12/319,191, Non Final Office Action dated Jul. 11, 2014", 11 pgs.
"U.S. Appl. No. 12/319,191, Notice of Allowance dated Dec. 5, 2014", 5 pgs.
"U.S. Appl. No. 12/319,191, Pre-Appeal Brief Request filed Dec. 13, 2010", 6 pgs.
"U.S. Appl. No. 12/319,191, Preliminary Amendment filed Dec. 31, 2008", 8 pgs.
"U.S. Appl. No. 12/319,191, PTO Response to Rule 312 Communication dated Mar. 12, 2015", 2 pgs.
"U.S. Appl. No. 12/319,191, Reply Brief filed Sep. 7, 2011", 5 pgs.
"U.S. Appl. No. 12/319,191, Response filed Jul. 1, 2010 to Non Final Office Action dated Mar. 2, 2010", 10 pgs.
"U.S. Appl. No. 12/319,191, Response filed Nov. 12, 2014 sto Non Final Office Action dated Jul. 11, 2014", 14 pgs.

"U.S. Appl. No. 12/319,191, Response filed Nov. 12, 2014 to Non Final Office Action dated Jul. 11, 2014", 14 pgs.
"U.S. Appl. No. 12/319,191, Response in RCE for Final Office Action filed Jun. 30, 2014 to Appeal Decision dated Apr. 29, 2014", 9 pgs.
"U.S. Appl. No. 13/929,142, Non Final Office Action dated Apr. 23, 2015", 8 pgs.
"U.S. Appl. No. 13/929,142, Notice of Allowance dated Oct. 14, 2015", 5 pgs.
"U.S. Appl. No. 13/929,142, Preliminary Amendment filed Jun. 27, 2013", 7 pgs.
"U.S. Appl. No. 13/929,142, Response filed Jul. 15, 2015 to Non Final Office Action dated Apr. 23, 2015", 10 pgs.
"U.S. Appl. No. 14/075,004, Advisory Action dated Nov. 10, 2015", 4 pgs.
"U.S. Appl. No. 14/075,004, Examiner interview Summary dated Oct. 26, 2015", 3 pgs.
"U.S. Appl. No. 14/075,004, Final Office Action dated Aug. 24, 2015", 7 pgs.
"U.S. Appl. No. 14/075,004, Non Final Office Action dated Apr. 29, 2015", 5 pgs.
"U.S. Appl. No. 14/075,004, Notice of Allowance dated Feb. 29, 2016", 5 pgs.
"U.S. Appl. No. 14/075,004, Preliminary Amendment filed Nov. 11, 2013", 8 pgs.
"U.S. Appl. No. 14/075,004, Response filed Jul. 15, 2015 to Non Final Office Action dated Apr. 29, 2015", 10 pgs.
"U.S. Appl. No. 14/075,004, Response filed Oct. 22, 2015 to Final Office Action dated Aug. 24, 2015", 14 pgs.
"U.S. Appl. No. 14/075,004, Response filed Dec. 24, 2015 to Advisory Action dated Nov. 10, 2015", 17 pgs.
"Chinese Application Serial No. 200580007916.9, Office Action dated Mar. 1, 2010", W/ English Translation, 9 pgs.
"Chinese Application Serial No. 200580007916.9, Office Action dated Jun. 8, 2008", W/ no. Translation, 9 pgs.
"Chinese Application Serial No. 200580007916.9, Office Action dated Aug. 3, 2010", W/ English Translation, 13 pgs.
"Chinese Application Serial No. 200580007916.9, Response filed May 14, 2010 to Office Action dated Mar. 1, 2010", W/ English Claims, 12 pgs.
"Chinese Application Serial No. 200580007916.9, Response filed Oct. 18, 2010 to Office Action dated Aug. 3, 2010", W/ English Claims, 18 pgs.
"Chinese Application Serial No. 200580007916.9, Response filed Oct. 21, 2008 to Office Action dated Jun. 6, 2008", W/ No English, 16 pgs.
"Chinese Application Serial No. 201110072089.9, Office Action dated Jan. 31, 2012", W/ English Translation, 15 pgs.
"Chinese Application Serial No. 201110072089.9, Office Action dated May 9, 2013", W/ English Translation, 12 pgs.
"Chinese Application Serial No. 201110072089.9, Office Action dated Nov. 5, 2012", W/ English Translation, 15 pgs.
"Chinese Application Serial No. 201110072089.9, Preliminary Amendment filed Nov. 17, 2011", W/ No English Translation, 17 pgs.
"Chinese Application Serial No. 201110072089.9, Response filed Jun. 14, 2012 to Office Action dated Jan. 31, 2012", W/ English Claims, 10 pgs.
"Chinese Application Serial No. 201110072089.9, Response filed Jul. 23, 2013 to Office Action dated May 9, 2013", W/ English Claims, 9 pgs.
"Chinese Application Serial No. 201110072089.9, Supplemental Amendment filed May 27, 2013", W/ English Claims, 9 pgs.
"European Application Serial No. 05705413.2, Office Action dated Jan. 12, 2007", 2 pgs.
"European Application Serial No. 05705413.2, Response filed Jul. 18, 2007 to Office Action dated Jan. 12, 2007", 18 pgs.
"European Application Serial No. 05810131.2, Decision to Grant dated Mar. 26, 2009", 2 pgs.
"European Application Serial No. 05810131.2, Office Action dated Sep. 1, 2006", 2 pgs.
"European Application Serial No. 09000404.5, Extended European Search Report dated Jun. 16, 2009", 4 pgs.

(56) References Cited

OTHER PUBLICATIONS

"International Application Serial No. PCT/US2005/000736, International Preliminary Report on Patentability dated Jul. 17, 2006", 6 pgs.

"International Application Serial No. PCT/US2005/000736, International Search Report dated Jun. 2, 2005", 3 pgs.

"International Application Serial No. PCT/US2005/000736, Written Opinion dated Jun. 2, 2005", 5 pgs.

"Malaysian Application Serial No. PI 20055395, Office Action dated Jan. 29, 2010", 6 pgs.

"Malaysian Application Serial No. Pi 20055395, Response filed Apr. 19, 2010 to Office Action dated Jan. 29, 2010", 8 pgs.

"Taiwanese Application Serial No. 094100725, Preliminary Amendment filed Oct. 20, 2006", W/ English Claims, 38 pgs.

METHOD FOR SIGNALING INFORMATION BY MODIFYING MODULATION CONSTELLATIONS

CROSS-REFERENCE TO RELATED APPLICATIONS

This application is a continuation of U.S. patent application Ser. No. 14/075,004, filed Nov. 8, 2013, now issued as U.S. Pat. No. 9,379,863, which is a continuation of U.S. patent application Ser. No. 13/929,142, filed Jun. 27, 2013, now issued as U.S. Pat. No. 9,270,429, which is a continuation of U.S. patent application Ser. No. 12/319,191, filed Dec. 31, 2008, which is a continuation of U.S. patent application Ser. No. 11/018,414, filed Dec. 20, 2004, now issued as U.S. Pat. No. 7,474,608, which claims the benefit of priority to U.S. Provisional Application No. 60/536,071, filed Jan. 12, 2004, all of which are hereby incorporated herein by reference in their entireties.

BACKGROUND OF THE INVENTION

In today's communications industry rapid advances in communication protocols and techniques are common. To facilitate widespread deployment of new systems, significant efforts are often made to ensure new communications techniques and systems are compatible with previous systems and devices, referred to herein as "legacy" systems or devices.

One problem associated with designing new generation systems is that, to be compatible with legacy systems, new generation systems often have to deal with limitations inherent in the legacy systems. For example, preamble training and signaling fields of packets for legacy wireless local area networks (WLANs) are already defined. To allow coexistence between legacy and new generation WLANs, it is desirable to preserve preambles having legacy compatible training and signaling fields. However, since legacy preambles may not be adequately designed to describe new generation packet structures, which may have longer lengths and/or require different training and signaling information, it can be challenging to quickly identify which type of packet structure, e.g., legacy or new generation, that follows a legacy compatible preamble.

Accordingly, a need exists to be able to quickly distinguish whether a packet having a legacy compatible preamble, may have a legacy packet structure or a newer generation packet structure. Solutions to allowing coexistence between legacy and new generation systems are therefore desired without significantly complicating or constraining the signaling in new generation packet structures.

BRIEF DESCRIPTION OF THE DRAWING

Aspects, features and advantages of the embodiments of the present invention will become apparent from the following description of the invention in reference to the appended drawing in which like numerals denote like elements and in which.

DETAILED DESCRIPTION OF THE INVENTION

Figure 1:
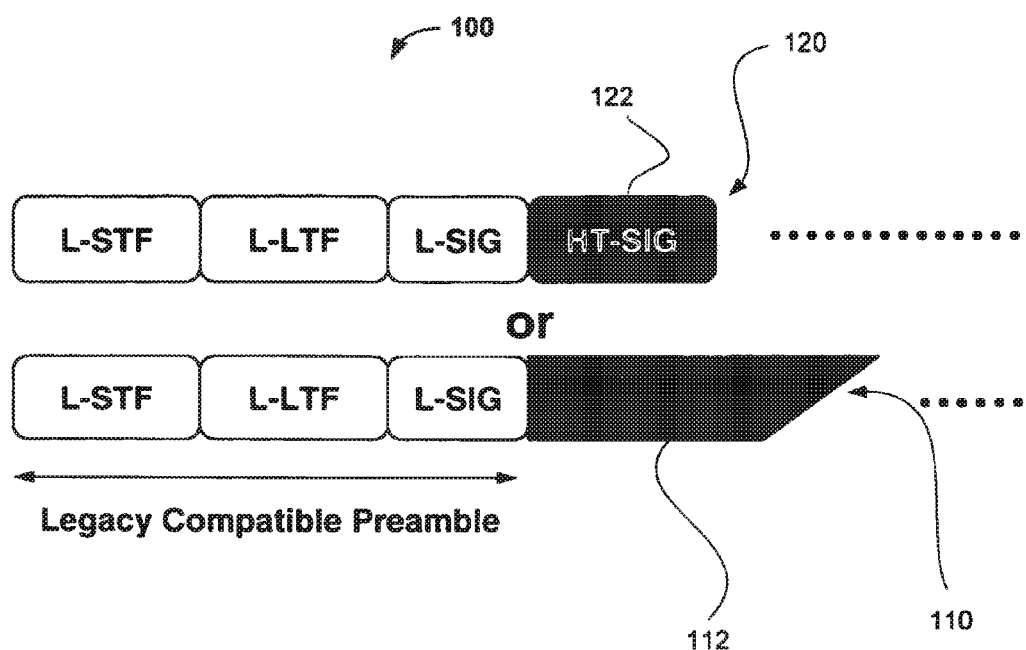
FIG. 1 shows block diagrams of two example packet structures for use with wireless networks.

While the following detailed description may describe example embodiments of the present invention in relation to wireless local area networks (WLANs), the invention is not limited thereto and can be applied to other types of wireless networks or air interfaces where advantages could be obtained. Such wireless networks include, but are not limited to, those associated with wireless wide area networks (WWANs) such as general packet radio service (GPRS), enhanced GPRS (EGPRS), wideband code division multiple access (WCDMA), code division multiple access (CDMA) and CDMA 2000 systems or other similar systems, wireless metropolitan area networks (WMANs), such as wireless broadband access systems including those supported by the Wordwide Interoperability for Microwave Access (WiMAX) Forum, wireless personal area networks (WPANs) and the like.

The following inventive embodiments may be used in a variety of applications including transmitters, receivers and/or transceivers of a radio system, although the present invention is not limited in this respect. Radio systems specifically included within the scope of the present invention include, but are not limited to, network interface cards (NICs), network adaptors, mobile stations, base stations, access points (APs), gateways, bridges, hubs and radiotelephones. Further, the radio systems within the scope of the inventive embodiments may include cellular radiotelephone systems, satellite systems, personal communication systems (PCS), two-way radio systems, two-way pagers, personal computers (PCs) and related peripherals, personal digital assistants (PDAs), personal computing accessories and all existing and future arising systems which may be related in nature and to which the principles of the inventive embodiments could be suitably applied.

The following inventive embodiments are described in context of example WLANs using orthogonal frequency division multiplexing (OFDM) and/or orthogonal frequency division multiple access (OFDMA) although the invention is not limited in this respect.

The Institute of Electrical and Electronics Engineers (IEEE) finalized an initial standard for WLANs known at IEEE 802.11 (1997). This standard specifies a 2.4 GHz operating frequency with data rates of 1 and 2 Mbps using either direct sequence or frequency hopping spread spectrum. The IEEE 802.11 working group has since published three supplements to the 802.11 standard: 802.11a (OFDM in 5.8 GHz band) (ISO/IEC 8802-11: 1999), 802.11b (direct sequence in the 2.4 GHz band) (1999 and 1999 Cor.-1/ 2001), and 802.11g (OFDM in the 2.4 GHz band) (2003). These systems, most notably 802.11a and 802.11g utilizing OFDM, are individually or collectively referred to herein as "legacy" WLANs.

The IEEE 802.11a standard specifies an OFDM physical layer that splits an information signal across 52 separate sub-carriers to provide transmission of data. The primary purpose of the OFDM Physical Layer is to transmit MAC (medium access control) protocol data units (MPDUs) as directed by the 802.11 MAC Layer. The OFDM Physical Layer is divided into two elements: the PLCP (physical layer convergence protocol) and the PMD (physical medium dependent) sublayers. The PLCP sublayer prepares MAC protocol data units (MPDUs) for transmission and delivers incoming frames from the wireless medium to the MAC Layer. The PLCP sublayer minimizes the dependence of the MAC layer on the PMD sublayer by mapping MPDUs into a frame format (also referred to as packet structure) suitable for transmission by the PMD.

Examples of frame formats or packet structures 100 for use in WLANs are graphically represented in FIG. 1 and may include a preamble portion for a receiver to acquire an incoming OFDM signal and synchronize the demodulator. The preamble may include one or more training fields and/or signaling fields (sometimes separately referred to as headers) including, for example, a legacy short training field (L-STF), a legacy long training field (L-LTF) and a legacy signaling field (L-SIG) 114, 124, which are collectively referred to herein as a legacy compatible preamble. The portion of packet structures 100 to follow the legacy compatible preamble may depend on whether the packet structure is a legacy packet structure 110 or a newer generation packet structure 120.

For legacy packet structures 110 one or more data fields 112 typically follow the legacy compatible preamble and the rate and length (in OFDM symbols) of the legacy packet structure 110 may be determined by a receiver from the values present in the L-SIG field 114 of the legacy preamble. However, the L-SIG field 124 may not be sufficient to describe new generation packet structures 120, such as those currently contemplated for adoption in the IEEE 802.11n standard for high throughput (HT) WLAN. By way of example, reserve bits in the L-SIG field may already be used by legacy devices for other purposes. Accordingly, additional signaling and/or training, generally depicted by HT-SIG block 122, may be needed to define the HT packet structure and/or synchronize the demodlulator to handle the HT modulation.

However, since an L-SIG field 114, 124 may be present in all legacy compatible preambles; it may be difficult for a receiver to know whether legacy data 112 follows the signaling field 114 or whether additional HT signaling or training 122 follows the signaling filed 124.

The long training symbols (L-LTF) that immediately precede the signal field 114, 124 allow a receiver to accurately estimate the clock phase so that demodulation of the signal field, for example, using binary phase shift keying (BPSK), is possible.

In generating OFDM signals, encoded and/or interleaved bits may be mapped on a transmit modulation constellation, for example, constellations for BPSK, quaternary phase shift keying (QPSK), and/or various quadrature amplitude modulation (QAM) modulation schemes. An inverse Fast Fourier Transform (FFT) may then be performed on the mapped complex values to generate an array of complex values to produce an OFDM symbol and for which multiple symbols are joined together to produce an OFDM frame. On the receiving end, an FFT is performed to retrieve the originally mapped complex values which are then demapped using the corresponding constellation and converted back to bits, decoded, etc.

Figure 2A:
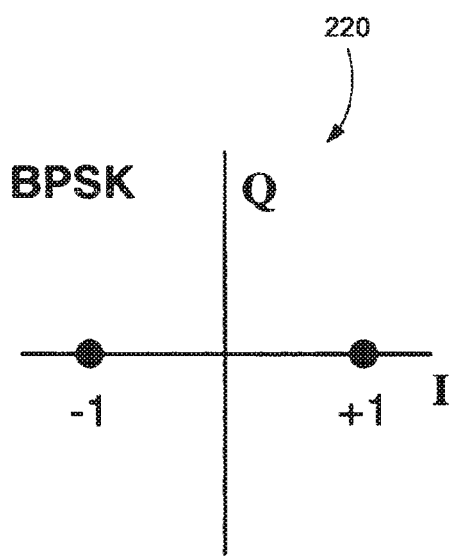
FIGS. 2a and 2b show respective graphs of different phases for a modulation constellation in order to distinguish packet structures according to one embodiment of the present invention.
Figure 2B:
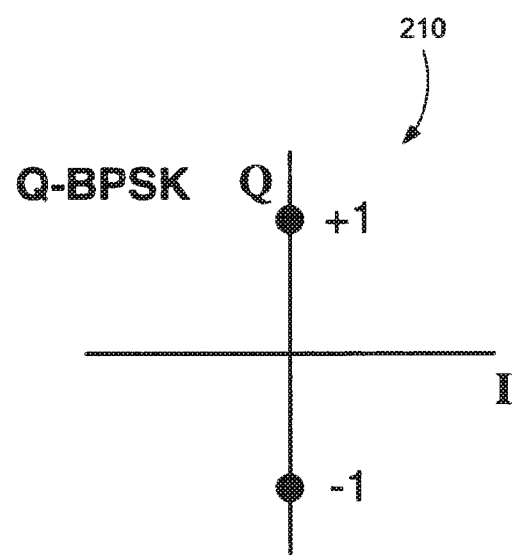

Turning to FIGS. 2a and 2b, in accordance with one embodiment, when the packet has a legacy packet structure (e.g., an IEEE 802.11a structure 110; FIG. 1), a traditional modulation constellation such as BPSK constellation 210 of FIG. 2a may be used for mapping complex values for one or more fields (e.g., 122, 112) of the legacy packet structure. Further, when the packet has a newer generation structure (e.g., IEEE 802.11n structure 120; FIG. 1) the one or more fields (e.g., 122, 112) may be modulated using a modified modulation constellation such as a BPSK constellation 220 having a phase rotation of 90 degrees as shown in FIG. 2b. Of course, the modified constellation 220 could be used for signaling legacy packet structures and traditional constellation 210 could be used for signaling new generation packet structures if desired. In this manner, information may be signaled to a receiver without modifying preamble structures or fields of the packets themselves.

Constellation 220 may be referred to as a BPSK-Q or Q-BPSK constellation since its coordinates (+1, −1) are positioned along the Q axis as opposed to traditional BPSK constellation 210 having coordinates (+1, −1) along the I axis.

The 90 degree rotation of a BPSK constellation is effective as it has no significant effect on the robustness of the packet field (e.g., signal field) with the modified modulation technique. However, the phase rotation for mapping values of a modulation constellation does not have to be 90 degrees and/or other types of modulation constellations such as those used for QPSK modulation and the like could also be used. Consequently, the inventive embodiments are thus not limited to any particular modulation constellation or degree of phase rotation.

Figure 3:
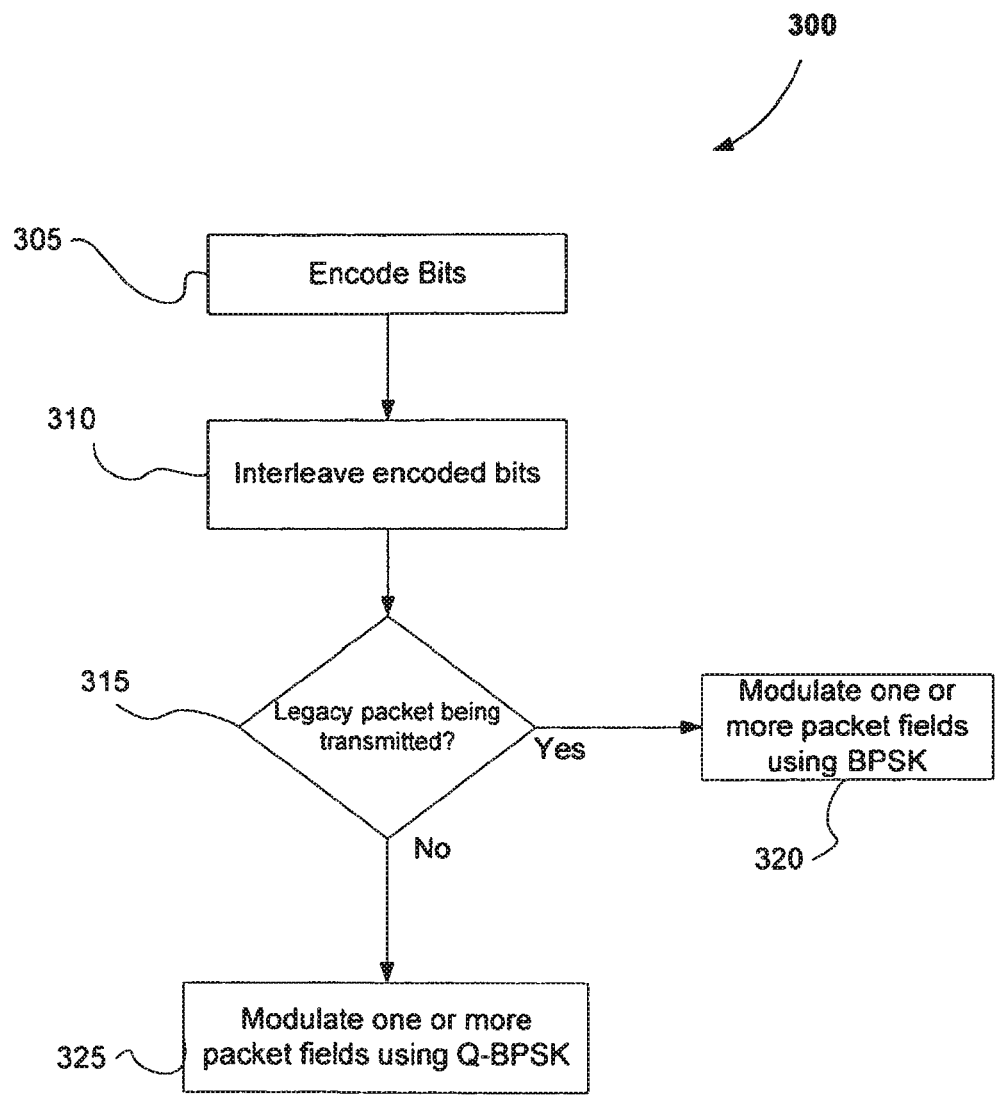
FIG. 3 is a flow diagram showing an exemplary method of communicating according to one embodiment of the present invention.

Turning to FIG. 3, a method 300 for transmitting in a wireless network may include modulating 325 one or more portions of a transmission using a modulation constellation having a modified phase in order to signal a receiving device of a type of packet structure associated with the transmission.

In certain embodiments, method 300 may include encoding bits 305 and interleaving 310 the encoded bits. If 315 a legacy packet structure is to be transmitted, one or more of the packet fields may be modulated 320 using traditional modulation constellations, such as a BPSK constellation (210; FIG. 2). On the other hand, if 315 a new generation packet structure is to be transmitted, one or more of the packet fields may be modulated 325 using a modified modulation constellation, such as a Q-BPSK constellation (220; FIG. 2).

In certain example embodiments, there may be two types of packet structures, a legacy packet structure substantially in conformance with an IEEE 802.11a type packet structure and a second packet structure substantially in conformance with an IEEE 802.11n type packet structure. In one example implementation, only the HT-SIG field (122; FIG. 1) of an HT packet structure may be modulated using Q-BPSK however, the embodiments are not limited in this manner. Further, in certain implementations, signaling a packet type using phase rotated modulation constellations may only be used for packets which have a data payload.

For a receiver, the decision about whether the signal field is a legacy modulation or a HT field could be made by examining the amount of energy in the I and Q components after the FFT. For example, if the Q energy is greater than the I energy (the threshold for which may be set as suitably desired), then the receiver may determine the packet has an HT-SIG field. Otherwise it may be a legacy packet or visa versa. Since this decision can utilize all data modulated subcarriers, for example, at least 48 for a 20 MHz WLAN system, this affords a 17 dB processing gain resulting in a highly reliable decision. The proposed detection scheme may only be applied to the data modulated subcarriers and pilot subcarriers can be handled differently if desired.

Figure 4:
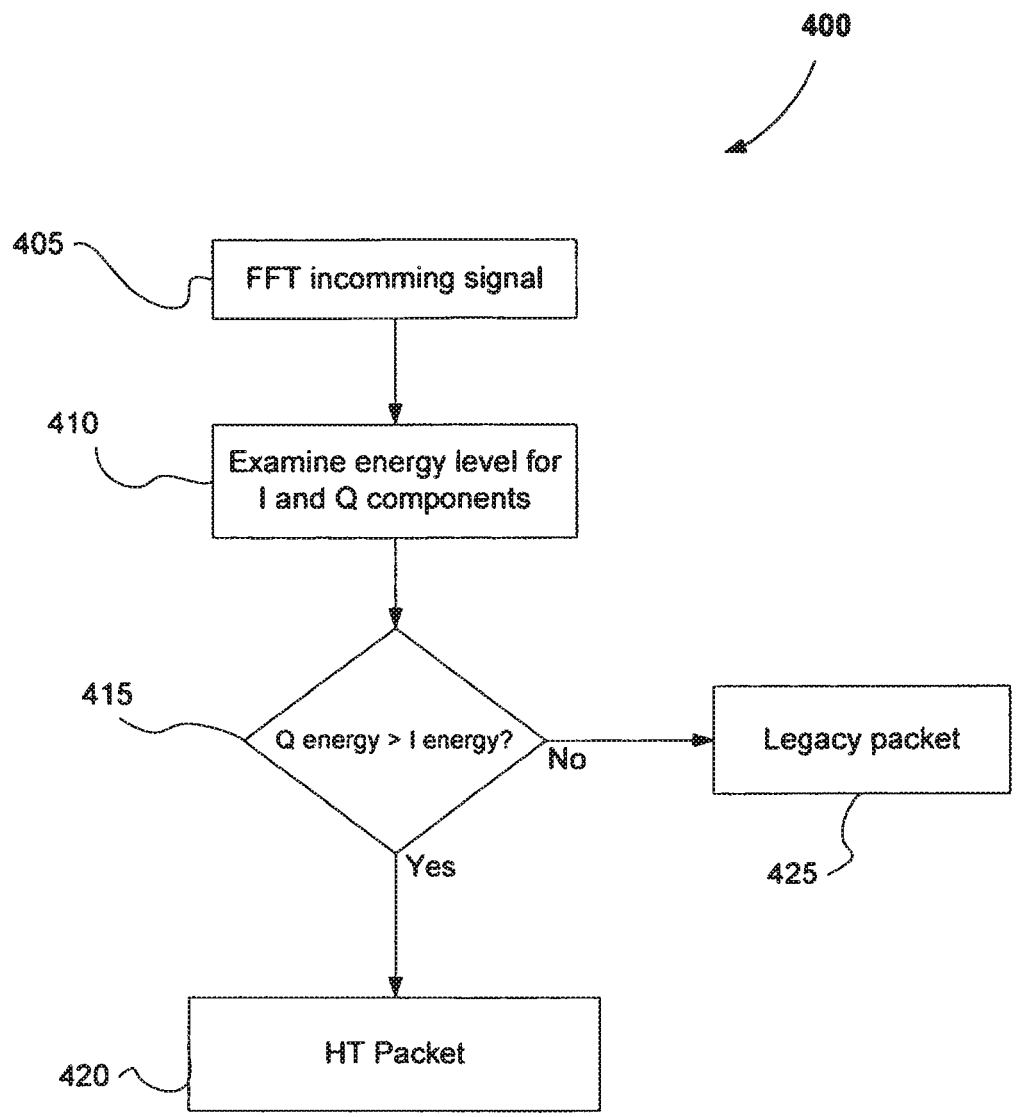
FIG. 4 is a flow diagram showing a method of detecting types of packet structure of a received transmission according to an embodiment of the present invention.

Turning to FIG. 4, a method 400 of receiving in a wireless network may include determining a type of packet structure associated with an incoming transmission based on an I and Q energy levels of a respective baseband signal.

In certain embodiments, method 400 may include performing 405 a FFT on a received transmission and examining 410 I and Q components after the FFT. If 415 the Q energy is significantly greater than the I energy, the associated packet field is determined 420 to be an HT-SIG field. Otherwise, it is identified 425 as being a legacy packet. The FFT values may then be demapped using the corresponding modulation constellations and converted back to bits, decoded, etc.

In an example implementation, the I and Q energy levels are used to determine whether a phase of a binary phase shift keying (BPSK) constellation used to map the HT-SIG field has been rotated although the embodiments are not limited in this respect.

Figure 5:
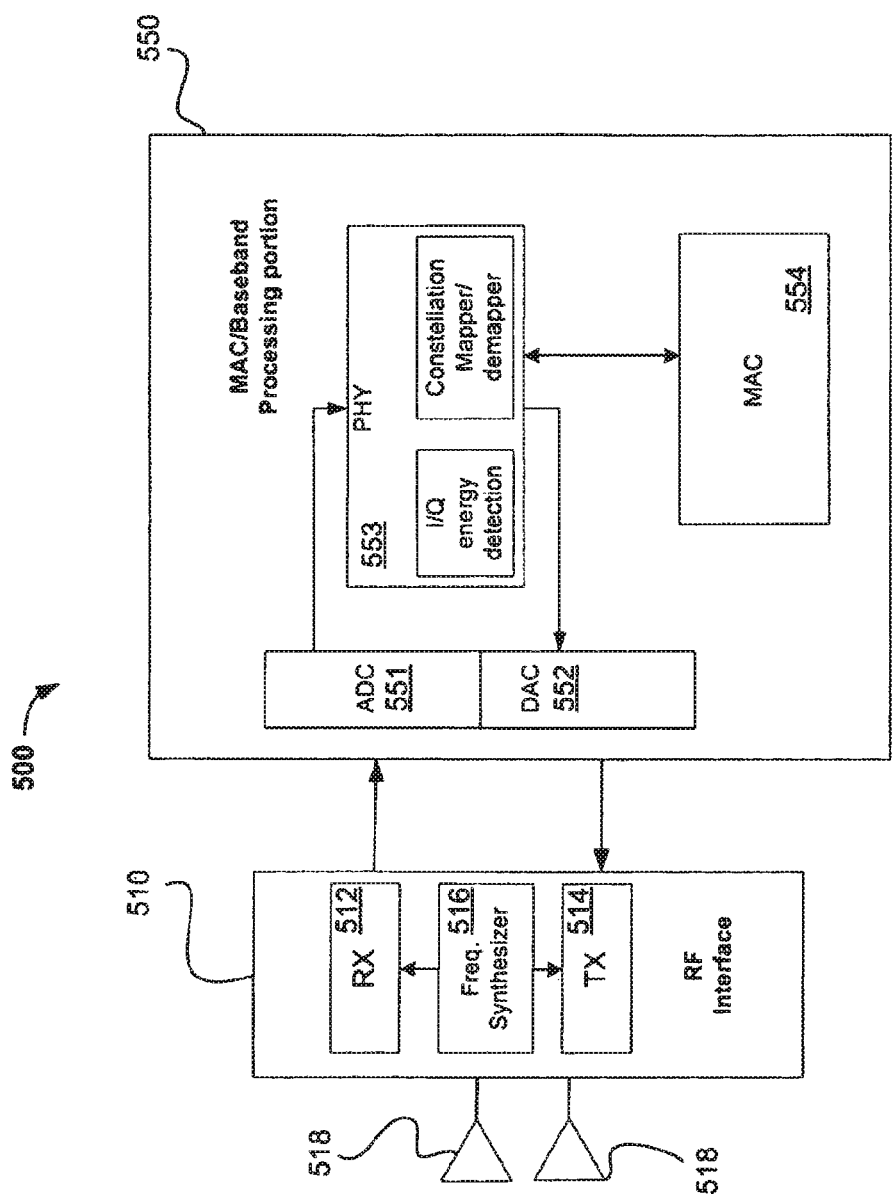
FIG. 5 is a functional block diagram of an example embodiment for a wireless apparatus adapted to perform one or more of the methods of the present invention.

Turning to FIG. 5, an example apparatus 500 for use in a wireless network may include a host processing circuit 550 may be any component or combination of components and/or machine readable code adapted to perform one or more of the methods described herein. In one example implementation, circuit 550 may include a baseband processing circuit 553 to modulate bits for at least a portion of a transmission using a modulation constellation having a modified phase in order to signal a receiving device of a type of packet structure associated with a transmission. Alternatively or in addition, baseband processing circuit 553 may be configured to detect energy levels of data modulated subcarriers as previously described. Apparatus 500 may also include a medium access controller circuit 554 and/or a radio frequency (RF) interface 510 if desired.

Host processing circuit 550 and/or RF interface 510 may include any hardware, software and/or firmware components necessary for physical (PHY) link layer processing and/or RF processing of respective receive/transmit signals for supporting the various air interfaces.

Apparatus 500 may be a wireless mobile station such as a cell phone, personal digital assistant, computer, personal entertainment device, wireless router, a network access station such as a WLAN access point (AP) or other equipment and/or wireless network adaptor therefore. Accordingly, the functions and/or specific configurations of apparatus 500 could be varied as suitably desired.

The components and features of apparatus 500 may be implemented using any combination of discrete circuitry, application specific integrated circuits (ASICs), logic gates and/or single chip architectures. Further, the features of apparatus 500 may be implemented using microcontrollers, programmable logic arrays and/or microprocessors or any combination of the foregoing where suitably appropriate.

It should be appreciated that apparatus 500 shown in the block diagram of FIG. 5 is only one functionally descriptive example of many potential implementations. Accordingly, division, omission or inclusion of block functions depicted in the accompanying figures does not infer that the hardware components, circuits, software and/or elements for implementing these functions would necessarily be combined, divided, omitted, or included in embodiments of the present invention.

Embodiments of apparatus 500 may be implemented using single input single output (SISO) systems. However, certain alternative implementations may use multiple input multiple output (MIMO) architectures having multiple antennas 518, 519.

Unless contrary to physical possibility, the inventors envision the methods described herein may be performed in any sequence and/or in any combination; and the components of respective embodiments may be combined in any manner.

Although there have been described example embodiments of this novel invention, many variations and modifications are possible without departing from the scope of the invention. Accordingly the inventive embodiments are not limited by the specific disclosure above, but rather should be limited only by the scope of the appended claims and their legal equivalents.

The invention claimed is:

1. An apparatus of a wireless device comprising: memory; and processing circuitry coupled to the memory, the processing circuitry configured to:
   process a first portion of a packet, the first portion of the packet comprising a legacy signal (L-SIG) field;
   determine whether a constellation of a field of a second portion of the packet is binary phase shift keying (BPSK) or quaternary binary phase shift keying (QBPSK); and
   process the second portion of the packet in accordance with a packet structure indicated by the constellation.

2. The apparatus of claim 1, wherein the field of the second portion of the packet comprises one or more orthogonal frequency division multiplexing (OFDM) symbols.

3. The apparatus of claim 2, wherein the modulation of BPSK or QBPSK of the constellation indicates a legacy packet structure or a non-legacy packet structure.

4. The apparatus of claim 2, wherein the modulation of BPSK or QBPSK of the constellation indicates a legacy packet structure or a newer packet structure.

5. The apparatus of claim 4, wherein the legacy packet structure is in accordance with a legacy Institute of Electrical and Electronic Engineers (IEEE) 802.11 standard, and the newer packet structure is in accordance with a newer IEEE 802.11 standard.

6. The apparatus of claim 2, wherein the L-SIG field is modulated with binary phase shift keying (BPSK), and the constellation is modulated with BPSK to indicate no rotation and modulated with quaternary binary phase shift keying (QBPSK) to indicate a 90 degree rotation.

7. The apparatus of claim 1, wherein the wireless device is one from the following group: a mobile station and an access point.

8. The apparatus of claim 7, wherein the mobile station is a wireless local-area network (WLAN) mobile station and the access point is a WLAN access point.

9. The apparatus of claim 1, further comprising transceiver circuitry coupled to the processing circuitry; and, one or more antennas coupled to the transceiver circuitry.

10. The apparatus of claim 2, wherein the modulation of BPSK of the symbol indicates the packet structure is in accordance with Institute for Electrical and Electronic Engineers (IEEE) 802.11a.

11. The apparatus of claim 2, wherein the modulation of QBPSK of the constellation indicates that the packet structure is in accordance with Institute for Electrical and Electronic Engineers (IEEE) 802.11n.

12. The apparatus of claim 11, wherein the processing circuitry is further configured to:
   determine whether the modulation is BPSK or QBPSK based on an energy level of an I signal component and a Q signal component of the constellation, wherein an energy level higher on the Q signal component than the I signal component indicates the QBPSK.

13. A non-transitory computer-readable storage medium that stores instructions for execution by one or more processors, the instructions to configure the one or more processors to cause a station to:
processs a first portion of a packet, the first portion of the packet comprising a legacy signal (L-SIG) field;
determine whether a constellation of a field of a second portion of the packet is binary phase shift keying (BPSK) or quaternary binary phase shift keying (QBPSK); and
process the second portion of the packet in accordance with a packet structure indicated by the constellation.

14. The non-transitory computer-readable storage medium of claim 13, wherein the modulation of BPSK of the constellation indicate the packet structure is in accordance with Institute for Electrical and Electronic Engineers (IEEE) 802.11a.

15. The non-transitory computer-readable storage medium of claim 13, wherein the phase rotation of QBPSK of the constellation indicates the packet structure is in accordance with Institute for Electrical and Electronic Engineers (IEEE) 802.11n.

16. A method performed by an apparatus of a wireless device, the method comprising:
processing a first portion of a packet, the first portion of the packet comprising a legacy signal (L-SIG) field;
determining whether a constellation of a field of a second portion of the packet is binary phase shift keying (BPSK) or quaternary binary phase shift keying (QBPSK); and
processing the second portion of the packet in accordance with a packet structure indicated by the constellation.

17. The method of claim 16, wherein the modulation of BPSK of the symbol indicates the packet structure is in accordance with Institute for Electrical and Electronic Engineers (IEEE) 802.11a.

18. An apparatus of a wireless device comprising: memory; and physical circuitry coupled to the memory, the physical circuitry configured to:
encode a first portion of a packet, the first portion of the packet comprising a legacy signal (L-SIG) field;
encode a constellation of a field of a second portion of the packet with binary phase shift keying (BPSK) or quaternary binary phase shift keying (QBPSK);
encode the second portion of the packet in accordance with a packet structure indicated by the modulation of BPSK or QBPSK of the constellation of the field; and
configure the wireless device to transmit the packet.

19. The apparatus of claim 18, wherein the L-SIG field comprises a length indicating a number of OFDM symbols of the packet.

20. The apparatus of claim 18, wherein the modulation of BPSK indicates the packet structure is in accordance with Institute for Electrical and Electronic Engineers (IEEE) 802.11a, and the modulation of QBPSK indicates the packet structure is in accordance with IEEE 802.11n.

21. The apparatus of claim 18, wherein the wireless device is one from the following group: a mobile station and an access point.

22. The apparatus of claim 21, wherein the mobile station is a wireless local-area network (WLAN) mobile station and the access point is a WLAN access point.

23. The apparatus of claim 18, further comprising transceiver circuitry coupled to the processing circuitry; and, one or more antennas coupled to the transceiver circuitry.

* * * * *